United States Patent [19]

Suzuki

[11] Patent Number: 5,999,245
[45] Date of Patent: Dec. 7, 1999

[54] PROXIMITY EXPOSURE DEVICE WITH DISTANCE ADJUSTMENT DEVICE

[75] Inventor: Shinji Suzuki, Kawasaki, Japan

[73] Assignee: Ushiodenki Kabushiki Kaisha, Tokyo, Japan

[21] Appl. No.: 09/048,113

[22] Filed: Mar. 26, 1998

[30] Foreign Application Priority Data

Mar. 27, 1997 [JP] Japan ................................. 9-075564

[51] Int. Cl.$^6$ ............................. G03B 27/42; G03B 27/02
[52] U.S. Cl. ................................................. 355/53; 355/78
[58] Field of Search ............................... 355/50, 53, 67, 355/77, 78, 86; 250/548, 492.2, 492.22; 356/399, 400, 401

[56] References Cited

U.S. PATENT DOCUMENTS

| | | | |
|---|---|---|---|
| 5,148,038 | 9/1992 | Nose et al. | 250/548 |
| 5,151,754 | 9/1992 | Ishibashi et al. | 356/356 |
| 5,155,370 | 10/1992 | Osawa et al. | 250/548 |
| 5,495,336 | 2/1996 | Nose et al. | 356/375 |
| 5,777,722 | 7/1998 | Miyazaki et al. | 355/53 |
| 5,883,701 | 3/1999 | Hasegawa et al. | 355/53 |

*Primary Examiner*—Safet Metjahic
*Assistant Examiner*—Hung Henry Nguyen
*Attorney, Agent, or Firm*—Sixbey, Friedman, Leedom & Ferguson; David S. Safran

[57] ABSTRACT

A proximity exposure device with a distance adjustment device in which sufficient determination sensitivity can be obtained even in areas with a low reflectance factor, such as on a glass surface, is achieved by a distance measurement part having a light source for measurement purposes, a pinhole plate, an objective lens, a light detection device and the like, light emerging form the light source for measurement purposes being emitted via the pinhole plate and objective lens onto the mask surface/workpiece surface, and light reflected thereby is detected via the objective lens and pinhole plate by the light detection device. If the mask surface/workpiece surface is located at the focal point of the objective lens on the object side, reflected light with high intensity is incident in the light detection device. To measure the distance between the mask and workpiece, the distance measurement part is moved in the Z-direction and two peaks of intensity of the reflected light of mask M and workpiece W are determined. Based on the position of the distance measurement part at this time, the distance between the mask and workpiece is determined. After measuring the distance between the mask and workpiece, the distance between the mask and workpiece is set to the desired value and exposure is performed.

6 Claims, 5 Drawing Sheets

PROXIMITY EXPOSURE DEVICE WITH DISTANCE ADJUSTMENT DEVICE

BACKGROUND OF THE INVENTION

1. Field of the Invention

The invention relates to a proximity exposure device with a distance adjustment device for setting the distance between a mask and a workpiece.

2. Description of Related Art

In proximity printing, a mask and a workpiece are fixed adjacent to one another, essentially parallel light is emitted from the mask side onto the workpiece, between the mask and the workpiece a microscopically small intermediate space being formed, and thus, the mask pattern is transferred onto the workpiece.

The reason that a microscopically small intermediate space is formed between the workpiece and mask is to avoid various types of damage, such as scratches on the mask or the workpiece by contact of the mask with the workpiece, mask impurities due to adhesion of a photo-resist film and the like formed on the workpiece on the mask, and similar damage.

To adjust the microscopically small intermediate space between the mask and workpiece, a process is conventionally used in which a strip, a sphere, and the like of metal or resin is inserted between the mask and workpiece as a spacer. In this process, the desired distance can be easily adjusted if the thickness of the spacer is selected (measured) beforehand.

This process prevents the mask and workpiece from coming into contact with one another over their entire surface. Therefore, the above described damage to which the mask and workpiece are subject can be reduced. Since, however as before, the mask and workpiece are partially in contact with one another via the spacer, the above described damage cannot be completely prevented.

To eliminate the above described defect, for example, Japanese patent disclosure document HEI 3-38024 and Japanese patent disclosure document HEI 3-38025 suggested measures. In the technology described in these two publications, there is a means for distance measurement and the described distance is set without contact of the mask with the workpiece. In this case, at three points within the mask surface/workpiece surface the distance is measured, the tilt of the workpiece carrier is adjusted such that the distances at the three points become the desired distances, and thus, the desired distance is reached without contact.

In the process described in the two aforementioned publications for distance measurement, in an optical system for measurement purposes, there is a mask on which a strip-like pattern is formed which is projected on the workpiece and mask, projected images being observed. Based on the difference between the position at which the projection image is focused on the mask, and the position at which the projection image is focused on the workpiece, the size of the distance is measured.

Furthermore, distance measurement processes for the same purpose are known from Japanese patent disclosure document SHO-63-138730, Japanese patent disclosure document HEI 5-226215, Japanese patent disclosure document HEI 6-5486, and Japanese patent disclosure document HEI 6-283400 and the like.

In the technology described in Japanese patent disclosure document SHO 63-138730, using an axicon, a halo (light ring) is formed which is emitted onto a mask and a workpiece, reflected light being picked up by a photo detector of the double ring type. Due to the different lengths of the optical path, as a result of the distance between the mask and the workpiece, the size of the halo reflected by the mask differs from the size of the halo reflected by the workpiece. This difference is determined by the photo detector of the double ring type, by which the value of the distance is measured.

In the technology described in Japanese patent disclosure document HEI 5-226215, there are beam-optical components, such as a diffraction grating, a zone plate, a grating lens and the like at locations on the mask where a measurement is desired. A light flux is obliquely incident through the aforementioned components in the workpiece and is reflected. The location of the spot of reflected light which has passed again through the beam-optical components and which has an angle of reflection which has been changed, is measured by means of a line sensor, by which the value of the distance is measured.

In the technology described in Japanese patent disclosure document HEI 6-5486, light from the bottom of the workpiece is obliquely incident. In a light receiving part which is likewise located on the bottom of the workpiece, the amount of deviation of the position of the light reflected from the mask surface from the position of the light reflected by the workpiece surface is determined, by which the amount of distance is measured.

In the technology described in Japanese patent disclosure document HEI 6-283400, a parallel light flux from the side of the mask and the workpiece is obliquely incident on the sides of the mask/workpiece. Either the intensity of the light which is broken by the mask/workpiece and has passed through, or the intensity of the light which has passed through the intermediate space, is measured. Here, the size of the distance is measured by using the relationship between the light intensity and the size of the distance.

In the above described prior art, the disadvantages are as follows:

(1) In the technology described in Japanese patent disclosure document HEI 6-38024, at measurement points of the mask and workpiece, reflection films are formed which reflect light to obtain reflected light intensity sufficient for observation of projected images.

Since here the measurable locations are limited to those where reflection films are formed, a measurement cannot be taken just anywhere on the mask/workpiece. The measurement areas are provided with reflection films which are unnecessary for a component, for example, of a liquid crystal display device or the like which is to be produced. Therefore, it is necessary to safeguard an area on the workpiece for measurement except for the area in which the component is formed. As a result, there is the disadvantage of a poor degree of utilization of the workpiece material. Furthermore, there is the disadvantage of an increase of production costs because, in the case of later removal of the reflection films, a process for removal of the reflection films is added to the production process.

(2) In the technology described in Japanese patent disclosure document HEI 3-38025, in which the technology described in Japanese patent disclosure document HEI 3-38024 is improved, reflection films are unnecessary. As follows from the publication, in the case of a small distance between the mask and workpiece a clear, strip-like pattern cannot be obtained because the intensity of the light reflected by the mask is essentially the same as the intensity of the light reflected by the workpiece and interference occurs.

Therefore, first of all, when the distance between the mask and workpiece at which no interference occurs is sufficient, a measurement is taken. Afterwards, the distance is reduced until a distance for actual exposure is reached and the exposure is performed. Therefore, it cannot be directly confirmed whether the distance at which, in fact, exposure is performed has the desired value.

The accuracy of the distance adjustment during exposure is determined by the accuracy of the movement device which sets the distance during measurement to the exposure distance. Therefore, there is the disadvantage that movement errors can neither be confirmed nor corrected, even if they are present.

(3) In the technology described in Japanese patent disclosure document SHO 63-138730, the disadvantage is the same as in Japanese patent disclosure document HEI 3-38025 because, in the case of a small distance, the intensity of the light reflected by the mask is essentially the same as the intensity of the light reflected by the workpiece, interference occurs, and a clear halo cannot be obtained.

(4) In the technology described in Japanese patent disclosure document HEI 5-226215, it is necessary to locate beam-optical components, such as a diffraction grating, a zone plate, a grating lens and the like, at the locations on the mask where measurement is desired. Therefore, there are the disadvantages that a measurement cannot be taken just anywhere and the mask is costly.

(5) In the technology described in Japanese patent disclosure document HEI 6-5486, it is necessary to insert the light source for purposes of measurement and the light detection part underneath the workpiece, i.e., within the workpiece carrier, which holds the workpiece stationary. For this reason, the arrangement of the workpiece carrier is extremely limited. Furthermore, there is the disadvantage that a measurement outside of the location where it is inserted cannot be taken, and therefore, measurement just anywhere is not possible.

(6) In the technology described in Japanese patent disclosure document HEI 6-283400, based on the feature of the measurement process in a measurement of the center areas of the mask/workpiece, the light intensity information is obtained as a result of the distance between the center areas together with the light intensity information based on the distance between the outside peripheral areas. Therefore, there is the disadvantage that the distance between the center areas cannot be exactly measured. This disadvantage becomes more pronounced, the larger the mask/workpiece. As a result, this technology cannot be used, especially in the case of treatment of a large mask/large workpiece as in the production of a video display element, such as a liquid crystal display device element and the like.

SUMMARY OF THE INVENTION

The invention was devised to eliminate the above described disadvantages in the prior art. Therefore, a first object is to devise a proximity exposure device with a distance adjustment device in which it is not necessary to produce reflection films, beam-optical elements and the like on the mask/workpiece, so that distance measurement is possible anywhere on the mask surface/workpiece surface, and sufficient determination sensitivity can be obtained even in areas with a low reflection factor, such as on a glass surface.

A second object of the invention is to devise a proximity exposure device with a distance adjustment device in which measurement of a small distance is possible without the insertion of a measurement part and the like within the workpiece carrier, and the distance can be measured and confirmed with high accuracy at the distance at which exposure is performed.

A third object of the invention is to devise a proximity exposure device with a distance adjustment device in which a cross sectional shape from a light source for purposes of measurement on the surface is formed on which the mask pattern is encompassed by the shape of at least one opening formed on the mask, the light is not covered by an area of the mask having a high reflectance factor, such as a metal film or the like, and also in a workpiece with low reflectance factor which is formed from glass or the like, the intensity of the light reflected by the mask and the intensity of the light reflected by the workpiece can be made essentially the same.

A fourth object of the invention is to devise a proximity exposure device with a distance adjustment device in which fluctuation of the light intensity of the light source is corrected for measurement purposes and the distance can be measured with high accuracy.

The above described objects are achieved according to the invention as follows:

(1) In a proximity exposure device which has an ultraviolet irradiation part for irradiation with UV radiation, a mask carrier part for holding the mask stationary, a workpiece carrier part for holding a workpiece stationary in a state in which the workpiece is adjacent to but at a distance from the mask, and a distance calibration device which is connected to the workpiece carrier and adjusts the distance between the workpiece and the mask, there are a distance measurement part, a device for moving the distance measurement part which continuously or incrementally moves the distance measurement part in a direction perpendicular to the mask and workpiece, a position detector for determining the position of the distance measurement part, and an arithmetic and logic unit for computing the distance between the mask and workpiece, in the distance measurement part there being a light source for measurement purposes, a beam splitter, a pinhole plate, an objective lens and a light detection device. A light source for measurement purposes is arranged such that the light emitted from this light source is focussed via the beam splitter onto the pinhole plate. The pinhole plate is located at a site which represents the focal point of the objective lens which is opposite the focal point on the object side and where the light from the light source for measurement purposes which has passed through the pinhole plate is focussed on the focal point on the object side of the objective lens. The light detection device is located at a site where the light is detected which has been reflected by the mask and workpiece, and which has passed through the objective lens, at least one pinhole, and the beam splitter. The value of the distance between the mask and workpiece is computed based on the intensity of the output signal from the light detection device and based on the output signal from the position detector by the arithmetic and logic unit.

(2) The objects are furthermore achieved in accordance with the invention by the pinhole of the pinhole plate being formed of a collection of several pinholes, in solution (1).

(3) The objects are furthermore achieved according to the invention by there being a second light detection device in the distance measurement part, in solutions (1) and (2), by the beam splitter being aligned such that the light from the light source for measurement purposes is divided into two parts, one part of which is radiated onto the pinhole plate and the other part of which is incident on the second light detection device, by the output signals from the light detection device and second light detection device being computed in the arithmetic and logic unit, and thus, fluctuation of the light intensity of the light source for measurement purposes is corrected.

(4) The objects are, furthermore, achieved in accordance with the invention by a polarizing beam splitter being used as the beam splitter, in solutions (1), (2) and (3), by the light emitted from the light source for measurement purposes being polarized in the first polarization direction by this polarizing beam splitter, and at the same time, this light with the first polarization direction being passed, by light with the second polarization direction which differs from the first polarization direction being incident on the light detection device, and furthermore, by a quarter wave plate being located in the optical path between the pinhole plate and the focal point on the object side, by which quarter wave plate the light polarized by the polarizing beam splitter with the first polarization direction is converted into a circular polarization, and at the same time, the light reflected by the mask and workpiece with the circular polarization is converted into light with the second polarization direction.

(5) The objects are, furthermore, achieved according to the invention by there being a second light source and image detection element in the distance measurement part, in solutions (1), (2), (3) and (4), by the second light source being located at a site where the light emitted from this light source is irradiated through the objective lens onto the mask and workpiece, and by the image detection element being located at a site where the images of the mask and workpiece are detected.

(6) The objects are furthermore achieved in accordance with the invention by a mask being used for purposes of production of an image display element, in solutions (1), (2), (3), (4), and (5), and by the cross sectional shape of the light flux from the light source for measurement purposes being formed on a surface on which the mask pattern of a shape which can be encompassed by an opening formed in the mask pattern area.

(7) In addition to a proximity exposure device, the invention also relates to a process for determining the distance between the mask and a workpiece.

In the invention according to solution (1), to measure the distance between the mask and workpiece, a projected image as described above is not used. Here, the intensity of the light reflected by the mask surface and the light reflected by the workpiece surface is used. Therefore, also in areas with a low reflectance factor, such as on a glass surface, sufficient determination sensitivity is obtained. It is, therefore, not necessary to provide reflection films, beam-optical components and the like on the mask and workpiece. Thus, a measurement anywhere on the mask surface and workpiece surface is enabled. Furthermore, the mask is prevented from being expensive.

Also, by the arrangement of a pinhole at the focal point of the objective lens which is opposite the focal point on the object side, the light reflected by a surface to be measured cannot, for the most part, pass through the pinhole and be incident on the light detection device, even if the surface to be measured deviates from the focal point of the objective lens on the object side only to a small degree. Therefore, even in the case of a small distance, it is possible to separate the light reflected by the mask from the light reflected by the workpiece with a high intensity ratio. Interference of the light reflected by the mask with the light reflected by the workpiece therefore does not occur.

Therefore, measurement and confirmation of the distance during exposure is possible with high accuracy.

Furthermore, it is not necessary to execute a special sequence for measurement.

In addition, the accuracy of the distance setting is prevented from being influenced by the accuracy of the movement device.

Moreover, it becomes possible to locate the distance measurement part on the mask side. Therefore, it is unnecessary to insert the measurement part within the workpiece carrier. As a result, the arrangement of the workpiece carrier not limited and measurement anywhere is possible. Especially in a measurement of the center areas of the mask and workpiece, the measurement result is prevented from being influenced by the distance between the outer peripheral areas. Accordingly, distance measurement with high accuracy is obtainable anywhere on even a large mask and large workpiece.

In the invention according to solution (2), by the above described measure that at least one pinhole is formed of a collection of several pinholes, even for a workpiece with a low reflectance factor, as in a glass workpiece, sufficient intensity of the reflected light can be obtained and the light reflected from the mask can be advantageously separated from the light reflected by the workpiece.

This means that a signal with a good S/N ratio can be obtained and a measurement taken with high accuracy if the intensity of the reflected light is to some extent large. In the case of a distance measurement in the manufacture of a video display element, for example, a liquid crystal display device element, a plasma display panel (PDP) and the like the workpiece is made of at least of translucent glass. The light reflectance factor in the case of such a glass workpiece is roughly 4% or less. In distance measurement, therefore, under certain circumstances sufficient intensity of the reflected light cannot be obtained. Here, there is the danger that the measurement accuracy is reduced.

If at least one pinhole is enlarged to obtain high intensity of the reflected light, the reflected light which can pass through at least one pinhole increases, even if the surface of the mask or workpiece to be measured deviates from the focal point of the objective lens on the object side. The light reflected by the mask and the light reflected by the workpiece are incident on top of one another on the light detection device. Here, it is therefore difficult to advantageously keep the light reflected by the mask and the light reflected by the workpiece apart.

If, on the other hand, the pinhole formed of a collection of several pinholes, as was described above, the intensity of the reflected light which is incident in the light detection device can be increased without increasing the size of the pinhole. Therefore, even in the case of a workpiece with a relatively low reflection factor, such as a glass workpiece, a measurement with high accuracy is enabled.

In the invention according to solution (3), in the distance measurement part, there is a second light detection device and by computing the output signals from the light detection device and the second light detection device the fluctuation of the light intensity of the light source for purposes of measurement is corrected, as described above. Therefore, when the light intensity of the light source for measurement purposes fluctuates due to a fluctuation of the power source and the like, a measurement with high accuracy can be taken without being influenced by the fluctuation of light intensity of the light source for purposes of measurement.

In the invention according to solution (4), a polarizing beam splitter is used as the beam splitter, as was described above. Furthermore, a quarter wave plate is located in the optical path between the pinhole plate and the focal point on the object side. This can prevent the light reflected by the pinhole plate from being incident on the light detection device. Therefore, the S/N ratio can be increased and a measurement taken with high accuracy.

In the invention according to solution (5), the above described arrangement of a second light source and an image detection element makes it possible to detect the images of the mask and workpiece. In this way, the site to be measured can be easily positioned and the site to be measured can be positioned exactly to the mask opening, even if the workpiece is a video display element, such as a liquid crystal display device element, a plasma display panel, and the like.

In the invention according to solution (6), the cross sectional shape of the light flux from the light source for measurement purposes is formed on the surface on which the mask pattern of a shape which can be encompassed by an opening formed in the mask pattern area, as was described above. The light is therefore prevented from being masked by the metallic foil of the mask. The intensity of the light reflected by the mask is, therefore, prevented from becoming extremely large. Thus, the intensity of the light reflected by the mask and the intensity of the light reflected by the workpiece can thus be made essentially the same in a workpiece with a low reflectance factor, such as a glass workpiece. Thus, distance measurement with high accuracy becomes possible.

For a distance measurement with high accuracy, it is a good idea to make the intensity of the light reflected by the mask and the intensity of the light reflected by the workpiece as equal as possible. If one of the two is extremely large, the signal of the weaker reflected light is covered by the signal of the stronger reflected light. Consequently, the light reflected by the mask cannot be separated from the light reflected by the workpiece.

To form the mask pattern, generally, a metallic film is used, such as a chromium film or the like. The reflectance factor of a metallic film is very high, and in the case of a chromium film is roughly 50 to 70%. The reflectance factor in the case of a glass workpiece, which can be used for producing a liquid crystal display device element or the like, is roughly 4% or less. Therefore, in the case of distance measurement, if the light flux radiated from the light source for measurement purposes, when passing through the mask from the area of the chromium film, is incident on the area of the Cr film and is masked by it, strong reflected light from the chromium film is formed by which the intensity of the light reflected by the mask is essentially greater than the intensity of the light reflected by the workpiece. As a result, a distance measurement with high accuracy cannot be obtained.

A workpiece of a video display element, such as a liquid crystal display device element, a plasma display panel, and the like, is comprised for the most part of pixel parts which are often used in distance measurement in their production.

In the case of producing a color filter and the like, in a mask, there is usually one opening per pixel. In a liquid crystal display device element, recently one pixel is divided into several pixels in order to improve the angle of view field. Here, an alignment layer in a certain area within one pixel is irradiated with ultraviolet radiation so that the property of the alignment layer is selectively activated. In this case, in a mask, there is at least one opening per pixel which is formed by dividing a pixel into small parts.

The above described measure, that the cross-sectional shape of the light flux from the light source for measurement purposes is a shape which can be encompassed by the above described opening formed in the mask pattern area, therefore prevents the light from the light source for measurement purposes from being masked by the area of the chromium film. The disadvantage that the light reflected by the mask and the light reflected by the workpiece cannot be kept apart is, therefore, eliminated. Thus, a measurement with high accuracy can be obtained.

In the following, the invention is further described using several embodiments shown in the drawings.

DETAILED DESCRIPTION OF THE PREFERRED EMBODIMENTS

Figure 1:
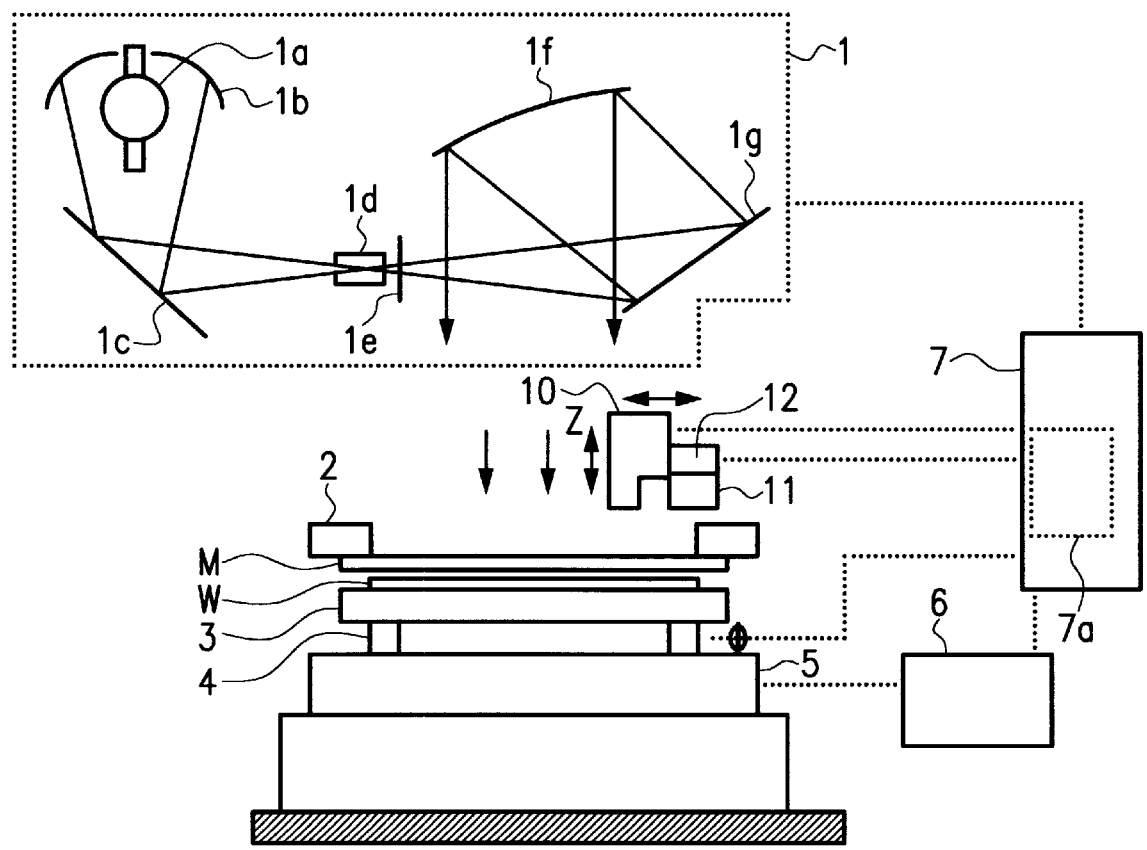
FIG. 1 shows a schematic of the arrangement of one embodiment of the proximity exposure device of the invention.

FIG. 1 schematically shows the arrangement of a proximity exposure device in accordance with one embodiment of the present invention which is comprised of a UV irradiation part 1 having a UV lamp 1a for emitting light containing UV radiation, a focusing mirror 1b for focusing the light emitted by the UV lamp 1a, a first mirror 1c, an interrogator lens 1d, a shutter 1e, and a collimating mirror comprised of a concave mirror 1f and a second mirror 1g.

The light emitted by the UV lamp 1a is focused by the focusing mirror 1b and is incident on the collimating mirror 1f via the first mirror 1c, interrogator lens 1d, shutter 1e, and second mirror 1g. The light emerging from collimating mirror If is emitted, via a mask M which is attached to mask carrier 2, onto a workpiece W seated on a workpiece carrier 3. In the case of a relatively small irradiation surface, instead of the collimating mirror if, a collimator can also be used. In this case, the mirror 1g is pointed downward, i.e. in a direction in which the light emerging from the integrator lens 1d is emitted onto the mask M. Here, the collimating lens is located between mirror 1g and mask M.

The workpiece carrier 3 is installed above a distance calibration device 4 in an X-Y-Θ-Z carrier 5. The tilt and position (distance between mask M and workpiece W) toward the top and bottom (hereinafter called the "Z direction") of the workpiece 3 are subjected to fine adjustment using distance calibration device 4.

The X-Y-Θ-Z carrier 5 is driven by a workpiece carrier movement device 6 in the X-Y-Θ-Z directions (e.g., X: toward the right and left in the figure, Y: in a perpendicular direction in and out of the page, Θ: in a direction of rotation around an axis perpendicular to the X-Y directions, and Z: toward the top and bottom of the page), by which workpiece carrier 3 is moved in the X-Y-Θ-Z directions.

A distance measurement part 10 which can be moved by means of a device above mask M (not shown in the drawing) for driving in the X-Y directions parallel to the surface of mask M. By moving distance measurement part 10 to any distance measurement point on the surface of mask M and the surface of workpiece W, a distance measurement can be taken at several measurement points. Furthermore, a distance measurement can also be taken at several measurement points by positioning distance measurement part 10 according to the number of distance measurement points.

Distance measurement part 10 can also be moved in the Z direction by a Z movement device 11 which is provided with a motor for moving the distance measurement part 10 via a spherical rotary spindle, a linear guide (not shown in the drawing) and the like. Furthermore, the Z movement device 11 for the distance measurement part is provided with an encoder 12 which functions as a position detector for determining the position and amount of movement of the distance measurement part 10.

A control element 7 controls the UV irradiation part 1, distance measurement part 10, Z movement device 11 and the workpiece carrier movement device 6. The output of the encoder which is located in the Z movement device 11 is sent to an arithmetic and logic unit 7a of the control element 7.

Figure 2:
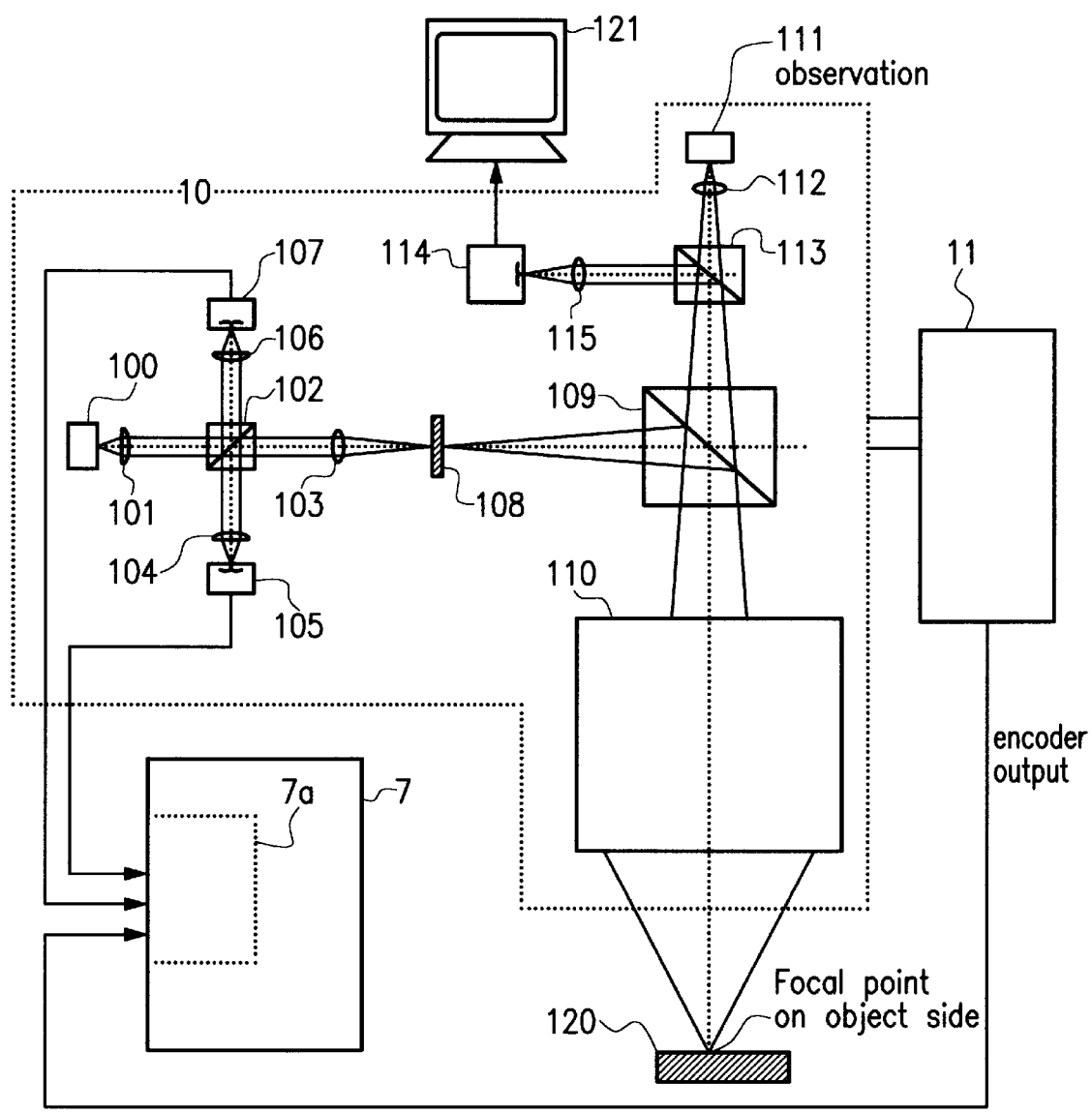
FIG. 2 shows a schematic of the arrangement of a first embodiment of the distance measurement part of the invention.

FIG. 2 shows a schematic of the arrangement of a first embodiment of the distance measurement part 10 in which a first light source 100 is used for distance measurement and for which a laser diode is used (in this embodiment) because it enables high irradiance to be obtained. For this reason, a halogen lamp, a xenon lamp, a LED and the like can be used.

The light emerging from the first light source 100 is converted by a lens 101 into essentially parallel light which is incident on a first beam splitter 102 and is divided by the first beam splitter 102. One part of the divided light is focused by a lens 103 on a pinhole plate 108 which is located at the focal point of an objective lens 110 which is opposite the focal point on the object side, as described above. The other part of the light divided by first beam splitter 102 is incident via a lens 106 in a second light detection device 107 which is positioned for determining the fluctuation of the light intensity of first light source 100 and for canceling the fluctuation, as described above. The signal determined by the second light detection device 107 is sent as a reference intensity signal to the arithmetic and logic unit 7a of control element 7.

Figure 3:
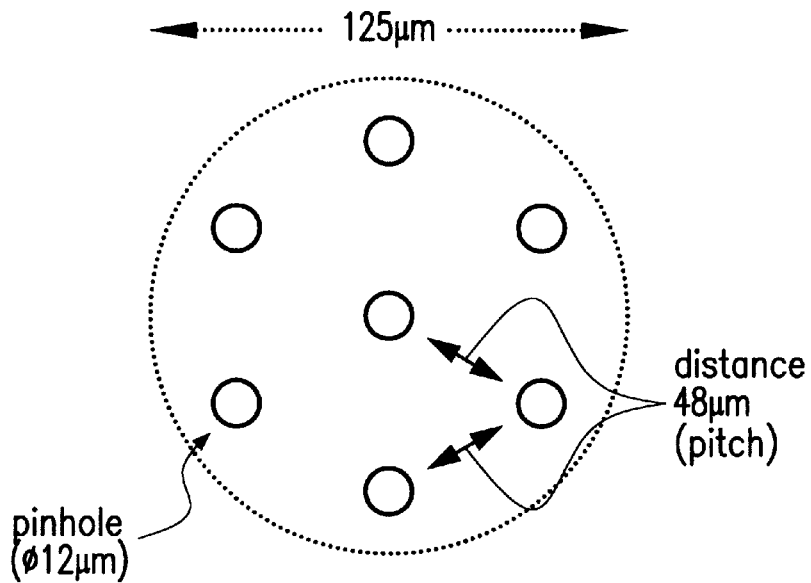
FIG. 3 shows an arrangement of the pinholes on the pinhole plate of one example.

Pinhole plate 108 is produced by vacuum evaporating a chromium film on a glass on which openings are formed by etching. As is shown, for example, in FIG. 3, openings with a diameter of 12 microns and at a distance relative to one another of 48 microns are located within an area with a diameter of 125 microns.

A pinhole plate can also be used which is easily produced by providing openings in a metal foil having a thickness of a few hundred microns. A pinhole plate of glass is, however, more resistant to mechanical shocks and is less deformed and expanded by heat.

Light which has passed through pinhole plate 108 is deflected by the second beam splitter 109 through an angle of 90 degrees, is incident on objective lens 110 and is focused on the focal point on the object side. The size of the light flux at the focal point on the object side can be computed using formula in which the size is set as being equal to the reciprocal value of the magnification factor (nominal value) of the objective lens multiplied by the size of the pinhole.

Here, the magnification factor of the objective lens is defined by the magnification factor in the case of incidence of light from the object side. In this case, the magnification factor is defined by the reciprocal value of the nominal value because the light is moving backwards.

In this embodiment, an objective lens 110 with magnification factor of 5x is used. The magnitude of the light flux is produced by the special configuration of the pinhole plate such that, in an area with a diameter of 25 microns, light spots with a diameter of 2.4 microns are located next to one another at a distance from one another of 9.6 microns. In the case in which the surface (hereinafter "surface 120 to be measured") of mask M or workpiece W is at the focal point on the object side of objective lens 110, the surface to be measured is illuminated by the spot of light with a diameter of 25 microns with the above described configuration.

The light reflected from surface 120 to be measured again passes through objective lens 110 and second beam splitter 109 and is focused on pinhole plate 108. Here, the size of the light flux of reflected light on pinhole plate 108 can be computed as being equal to the magnitude of the spot illumination light on surface 120 to be measured multiplied by the magnification factor of the objective lens The size of the light flux in this embodiment is represented by the fact that, in an area with a diameter of 125 microns, spots of light with a diameter of 12 microns are located next to one another at a distance of 48 microns from one another.

In the case in which surface 120 to be measured is at the focal point of objective lens 110 on the object side the size of the light flux of reflected light is equal to the size of the pinhole. The reflected light can therefore pass essentially completely through pinhole plate 108.

The reflected light which has passed through pinhole plate 108 is converted by lens 103 essentially into parallel light. Afterwards it is deflected by first beam splitter 102 by an angle of 90 degrees, is focused by means of lens 104 in first light detection device 105 and is incident thereon.

Figure 4:
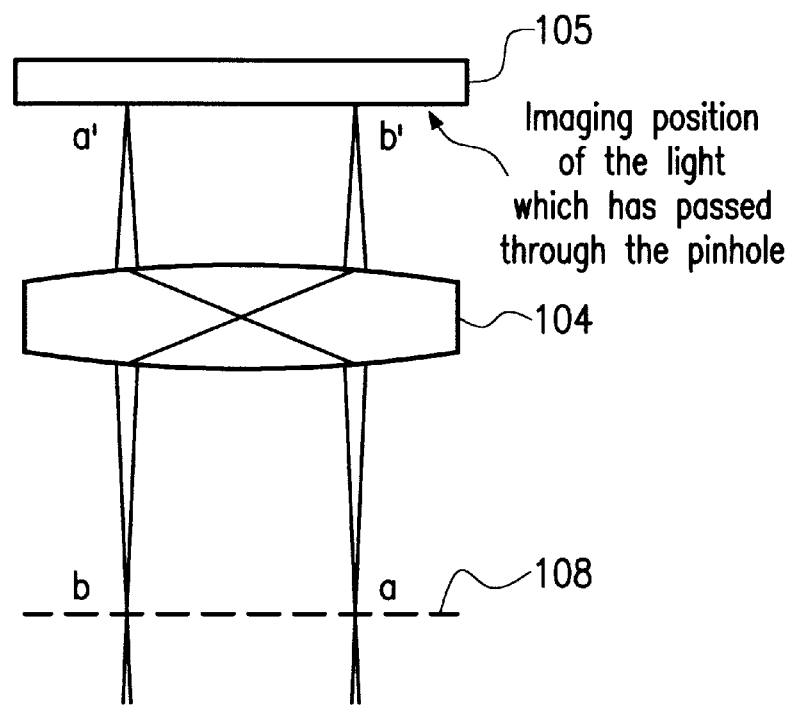
FIG. 4 shows a schematic of the image of the reflected light via several pinholes on the light detection surface of a first light detection device.

FIG. 4 shows a schematic of the image of the light reflected, via several pinholes located in pinhole plate 108, on the light detection surface of first light detection device 105. The figure does not show first beam splitter 102 and lens 103. In the case in which surface 120 to be measured is located at the focal point of objective lens 110 on the object side, on the light detection surface of first light detection device 105 the light which has passed through the pinholes is imaged in a spot-like manner, as is shown in the drawing.

In the case in which, for first light detection device 105, a collection of small light detection elements, such as CCD elements, is used, the sensitivity of the individual small light detection element exhibits scatter. Therefore, when the position of the imaged spotlight changes, there are cases in which the output of first light detection device 105 fluctuates. Furthermore, when using relatively large light detection elements, such as photodiodes, for first light detection device 105, as a result of the scatter which occurred in the production of the light detection elements, depending on the site of the light detection surface, scatter of the sensitivity often occurs. As a result, there are cases in which the output of first light detection device 105 fluctuates.

As was described above, by the arrangement of several pinholes in pinhole plate 108, the scatter of sensitivity of the light detection elements with respect to the position of the light which is incident on first light detection device 105 can be averaged. Furthermore, the fluctuation of the output value from first light detection device 105, in case of vibration or position deviation of pinhole plate 108 and the like, can be reduced.

Furthermore, high sensitivity can be obtained by there being several pinholes. In the case of a single pinhole, to achieve high sensitivity the number of photons reaching light detection device 105 must be increased. For this reason, the irradiance of first light source 100 must be increased. However, if the irradiance is increased, it is possible for burning of first light detection device 105 to occur. If there are several pinholes, conversely, the number of photons which reach the first light detection device 105 per unit of time can be increased without increasing the irradiance of first light source 100.

The signal of the intensity of the light which has been detected by first light detection device 105 in the above described manner is sent to arithmetic and logic unit 7a. Arithmetic and logic unit 7a, by increasing the signal of the intensity of the light which is incident on first light detection device 105, judges that the surface 120 to be measured is located at the focal point on the object side.

On the other hand, in the case in which surface 120 to be measured is not located at the focal point of objective lens 110 on the object side, the light flux of the light source for measurement purposes blurs on surface 120 to be measured, and therefore, becomes a strongly dispersed spotlight. The reflected light likewise blurs on pinhole plate 108, and therefore, continues to diffuse.

Therefore, the reflected light cannot, for the most part, pass through pinhole plate 108 and is not incident in the first light detection device 105. Also in the case of several pinholes, the blurred light hardly passes though the adjacent pinhole because the pinholes have a sufficient spacing relative to one another of 48 microns. Furthermore, in the case in which the spot becomes so large that it covers the adjacent pinhole, the case in which the surface to be measured is located at the focal point of the objective lens on the object side, and the case in which it is not located there, can be kept apart with a sufficient intensity ratio because the surface of the light which passes through the pinhole is smaller than the area of the diffused spot to a sufficient degree.

In the case in which surface 120 to be measured deviates only slightly from the focal point of objective lens 110 on the object side, the intensity of the reflected light which is incident in first light detection device 105 is greatly reduced, as was described above. Therefore, the light reflected from mask M and the light reflected by workpiece W can be advantageously kept apart.

If, in this case, the intensity of the light emerging from first light source 100 fluctuates, the intensity of the light incident in first light detection device 105 also fluctuates. In this embodiment, therefore, there is second light detection device 107, as was described above. Thus, the intensity of the light emerging from first light source 100 is determined with a fluctuation which is canceled.

From second light detection device 107, the light emerging from light source 100 which has been divided by first beam splitter 102 is detected and sent as a reference intensity signal to arithmetic and logic unit 7a. In arithmetic and logic unit 7a, the signal of the intensity of the light detected by first light detection device 105 is divided by the reference intensity signal and the fluctuation of the intensity of the light emerging from the light source 100 is equalized.

Furthermore, in this embodiment, to observe the measurement position, a second light source 111 serving as an illumination light source, a lens 112, a third beam splitter 113 and an image detection element 114 are provided. A LED was used as second light source 111. For this reason, however, as in first light source 100, a laser diode or other light source can be used. A CCD camera was used as the image detection element 114.

The light emerging from second light source 111 passes through third beam splitter 113, second beam splitter 109 and objective lens 110 and illuminates surface 120 to be measured. The image of the surface to be measured passes through objective lens 110, second beams splitter 109 and third beam splitter 113 and is imaged by lens 115 on image detection element 114. The signal of the image detected by the image detection element 114 is sent to a monitor 121 on which the image of the surface to be measured is produced.

The reason for there being a second light source 111 independently of first light source 100 for measurement purposes is the following:

The light from first light source 100 is emitted by pinhole plate 108 in the form of a small spot and is therefore not suited for observing the overall image.

In this embodiment, distance measurement part 10 is made compact, as was described above. Second light source 111 was therefore located within distance measurement part 10. However, illumination can also be placed outside distance measurement part 10. In this case, a fiber illumination system which is generally used to illuminate a microscope, a ring illumination system which is located on the tip of the objective lens and the like can be used.

As was described above, by the arrangement of the optical system for purposes of observation being comprised of the second light source 111, lens 112, third beam splitter 113, and image detection element 114, locating of the measurement position can be easily achieved.

In the following, taking the distance measurement is described using the above described distance measurement part.

Distance measurement part 10 is moved parallel to the surface of mask M by observing monitor 121. Distance measurement part 10 is moved to a distance measurement position.

Then, the motor of the Z-movement device 11 for the distance measurement part is driven and the distance measurement part 10 is moved in the Z direction. The intensity of the reflected light which is incident on first light detection device 105 is read out by reading the position of the distance measurement part 10 in the Z direction by encoder 12, encoder 12 being a position detector located in Z-movement device 11 for the distance measurement part.

If Z-movement device 11 for the distance measurement part is driven such that the focal point of objective lens 110 on the object side intersects both the surface of mask M and also the surface of workpiece W in one longitudinal direction, strong reflected light is obtained if the surface of mask M or the surface of workpiece W reaches the focal point of objective lens 110 on the object side, as was described above. Therefore, two strong peaks of intensity of the reflected light can be obtained with respect to the moved position.

In arithmetic and logic unit 7a, these two peaks of intensity of the reflected light are determined. Based on the output of encoder 12 as a position detector, at this time, the distance between the mask M and the workpiece W is computed. In the case in which Z-movement device 11 is not driven continuously for the distance measurement part, but is driven incrementally from stage to stage, the amount of motion of one movement stage is set to an amount which is sufficiently smaller as compared to the distance value. If Z-movement device 11 for the distance measurement part is stopped, the position signal determined by the encoder and the information on the intensity of the reflected light which is detected by first light detection device 105 is read in arithmetic and logic unit 7a.

Figure 5:
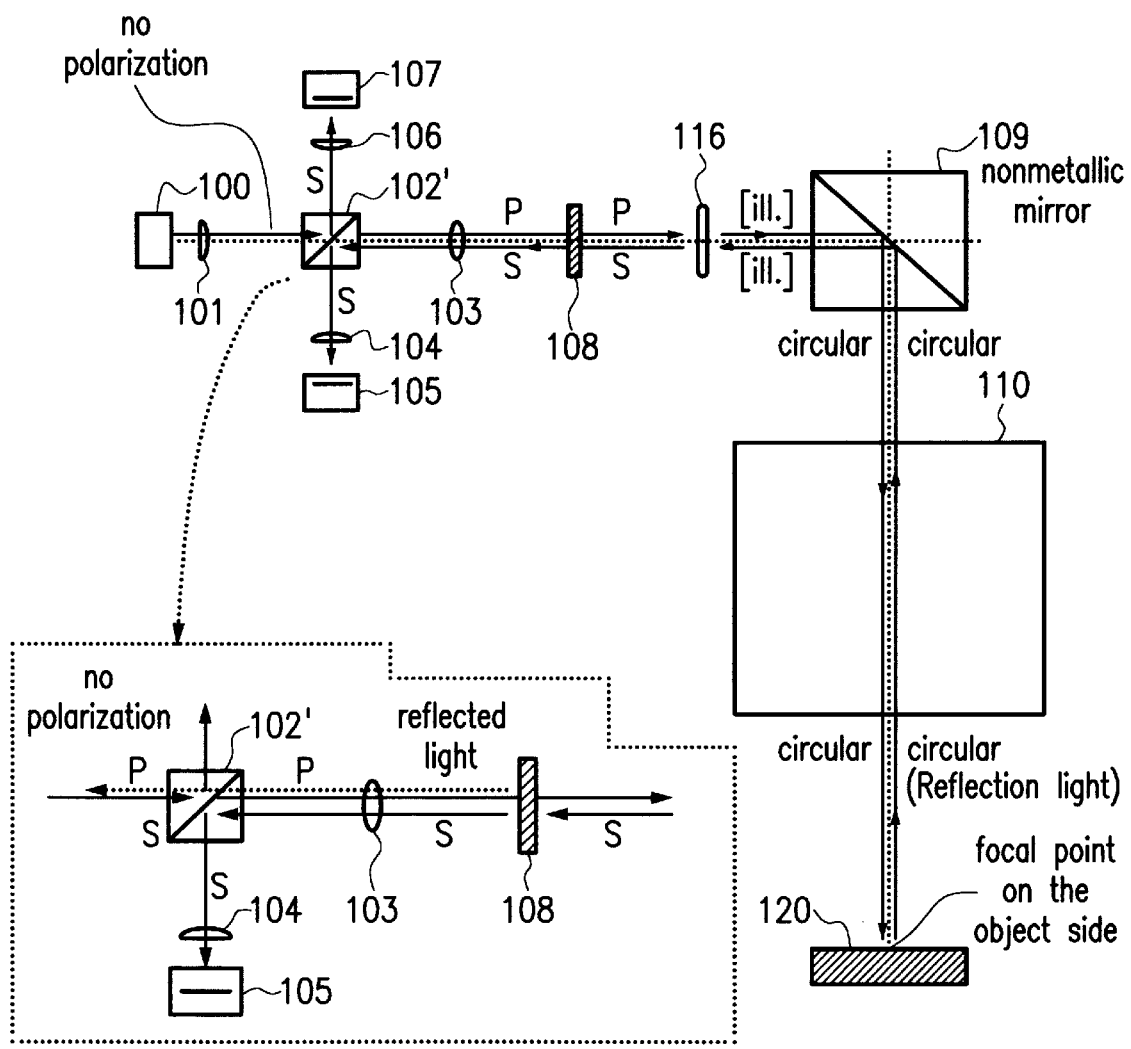
FIG. 5 shows a schematic of the arrangement of a second embodiment of the distance measurement part according to the invention.

FIG. 5 is a schematic of a second embodiment of the distance measurement part 10 of the invention. In this embodiment, a polarizing beam splitter and quarter wave plate are used. This prevents the light reflected by pinhole plate 108 from being incident in the first light detection device 105. In this way, the S/N ratio is prevented from decreasing.

In the FIG. 5, the same parts as in FIG. 2 are provided with the same reference numbers; but, in this embodiment, instead of the first beam splitter 102 in FIG. 2, a polarizing beam splitter 102' is used and a quarter wave plate 116 is located in the optical path between pinhole plate 108 and second beam splitter 109.

The process of distance measurement in this embodiment is carried out fundamentally in the same manner as in the FIG. 2 embodiment. In this embodiment, the above described use of a polarizing beam splitter and quarter wave plate prevents the light reflected by pinhole plate 108 from being incident on first light detection device 105, as is described above.

The light emerging from first light source 100 which is not polarized is converted by lens 101 into essentially parallel light which is incident on polarizing beam splitter 102'. The P polarized light passes through polarizing beam splitter 102' and is focused by means of lens 103 on pinhole plate 108. In the case in which one part of the light is reflected by pinhole plate 108, this reflected light passes unchanged through the polarizing beam splitter 102' and returns to first light source 100 because it is P-polarized light with a P-polarization direction.

The S-polarized light is deflected in polarizing beam splitter 102' by an angle of 90 degrees and is incident via lens 106 on second light detection device 107. The output of second light detection device 107 is sent to arithmetic and logic unit 7a, as was described above, and is used to cancel the fluctuation of the light intensity of first light source 100.

The P-polarized light which has passed through pinhole plate 108 is converted by quarter wave plate 116 into circular polarization, which is subsequently deflected by means of second beam splitter 109 by an angle of 90 degrees, is incident in objective lens 110 and is focused in the focal point on the object side.

The reflected light with circular polarization which has been reflected by the surface 120 to be measured passes again through objective lens 110 and second beam splitter 109, is incident in quarter wave plate 116, is converted into light with a S-polarization direction and is focused on pinhole plate 108. The S-polarized light which has passed through pinhole plate 108 is converted by lens 103 into essentially parallel light, and afterwards, is incident on polarizing beam splitter 102'. The reflected light with the S polarization direction which is incident in polarizing beam splitter 102' is deflected by an angle of 90 degrees, focused in the first light detection device 105 by lens 104 and is incident therein.

As was described above, in this embodiment, by using polarizing beam splitter 102' and quarter wave plate 116, only the light reflected by surface 120 to be measured at the focal point on the object side can be incident in first light detection device 105 without the light reflected by pinhole plate 108 being incident in first light detection device 105. Therefore, the S/N ratio can be increased and a measurement taken with high sensitivity.

In this embodiment, the quarter wave plate 116 is located between pinhole plate 108 and second beam splitter 109. However, the quarter wave plate 116 can be placed anywhere between pinhole plate 108 and the focal point on the object side, and at this site, the same action as the one described above can be obtained.

Furthermore, in this embodiment, it is a good idea for the incident light with the circular polarization to be reflected unchanged by second beam splitter 109. It is, therefore, not desirable to use a conductive, metallic mirror, which changes the polarization instead of second beam splitter 109.

Additionally, the same action as the one described above can also be obtained when the position of the first light detection device 105 is replaced by the position of the first light source 100 in FIG. 5. In this case, from the nonpolarized light which has been emitted from first light source 100, the S-polarized light passes through polarizing beam splitter 102' and lens 106 and is incident in second light detection device 107, while the P-polarized light is deflected by an angle of 90 degrees and is focused by lens 103 onto pinhole plate 108. Furthermore, the light incident on the quarter wave plate 116 and reflected by the surface 120 to be measured is converted into P-polarized light, passes through polarizing beam splitter 102' and is incident in first light detection device 105.

In the following, exposure is described using the proximity exposure device in this embodiment.

(a) Workpiece W is placed on workpiece carrier 3 and attached by means of a vacuum suction device (not shown).

(b) X-Y-Θ-Z carrier 5 is driven in the Z-direction and workpiece W is caused to approach mask M. In doing so, workpiece W is moved in the Z-direction, the position signal being read in by an encoder (not shown) which is located in X-Y-Θ-Z carrier 5. Workpiece W is moved nearer until a desired distance value is essentially reached. In this step, the distance between mask M and workpiece W does not yet agree exactly with the desired distance.

(c) In above described state (b), if necessary positioning of mask M relative to workpiece W is performed. This positioning is done such that mask M and workpiece W are provided beforehand with alignment marks and these alignment marks are observed with an alignment microscope (not shown). This can be done both automatically and manually.

(d) Next, for purposes of distance measure, the distance measurement part 10 is moved by means of the device for moving the distance measurement part in the X-Y directions to a distance measure point. Here, fine adjustment of the measurement site is performed, if necessary. For fine adjustment of the measurement site of distance measurement part 10, the optical system comprised of second light source 111, lens 112, third beam splitter 113 and image detection element 114 is used for purposes of observation and the image shown in monitor 121 is observed. For fine adjustment of distance measurement part 10, the device for moving the distance measurement part in the X-Y directions can be used, or a micrometer for fine adjustment can be added.

In the production of a liquid crystal display device and a plasma display panel (PDP), the workpiece is made of glass. Therefore, here, the intensity of the light reflected by the mask and the intensity of the light reflected by the workpiece can be made essentially the same by the light flux of first light source 100 for measurement purposes being positioned exactly to the opening of mask M. Thus, a measurement can be taken with high precision.

Figure 6:
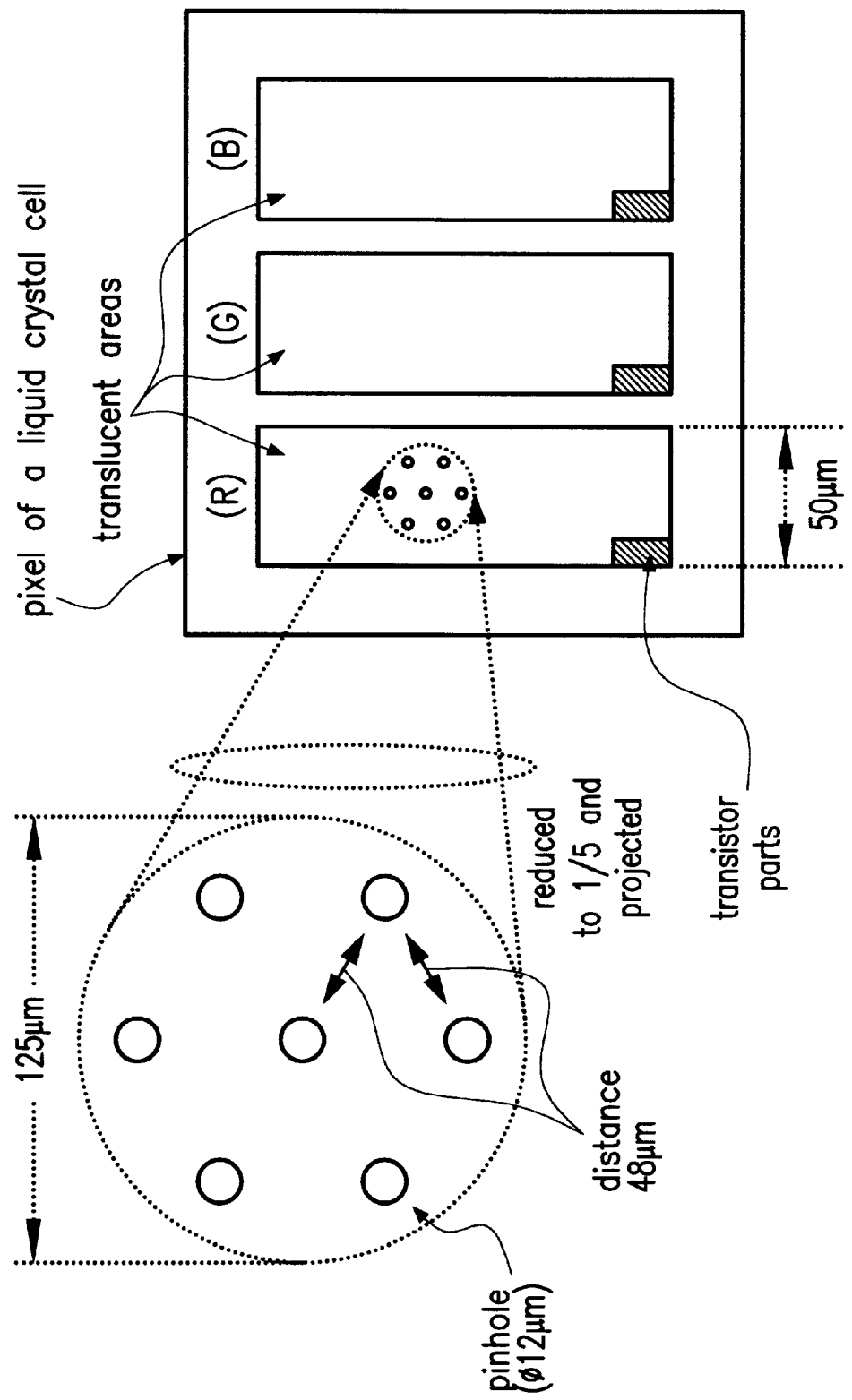
FIG. 6 shows a schematic of a pixel of a color liquid crystal cell and a projected image of a pinhole in one example.

FIG. 6 is a schematic which shows a pixel of a color liquid crystal cell and a projected image of the pinholes on one example. As is shown in the drawing, a pixel of a color liquid crystal cell has translucent areas (openings) which correspond to R, G and B. Their width is roughly 50 μm, as is shown in the drawing.

Here, a pinhole plate 108 is used in which openings with a diameter of 12 microns are located next to one another spaced by distance 48 microns relative to one another in an area having a diameter of 125 microns, as was described above. If an objective lens 110 with a magnification of 5x is used, the projected image of the pinholes on the color liquid crystal cell is reduced to ⅕ x, and it is located within the translucent area of 50 microns, as shown in FIG. 6.

As was described above, an optical system for purposes of observation is used which observes the monitor shown in monitor 121, and distance measurement part 10 is moved such that the image of the pinholes is projected into the translucent area of the color liquid crystal cell. Thus, the intensity of the light reflected by mask M and the intensity of the light reflected by workpiece W can be made essentially the same, and thus, measurement with high precision can be achieved, as was described above.

The case of a color liquid crystal cell is shown using FIG. 6. In a PDP (plasma display panel), however, by moving the distance measurement part 10 such that images of the pinholes are projected into the translucent areas, the intensity of the light reflected by mask M and the intensity of the light reflected by workpiece W can be made essentially the same because a PDP also has the same translucent areas as in the above described example. Thus, measurement with high precision can be achieved.

In the case of a mask in which the above described pixel division exposure is done, determination can be performed with high sensitivity as in the above described example if, on pinhole plate 108, pinholes are formed which have a size and arrangement which are taken into account, such that the projected images of the pinholes are encompassed by one opening of the divided pattern.

(e) After the distance measurement part 10 has been moved to the distance measurement point, it is moved in the Z direction such that the focal point of objective lens 110 on the object side intersects both the surface of mask M as well as the surface of workpiece W in the longitudinal direction, as was described above. Thus, two peaks of the intensity of the reflected light are determined. Based on the output of encoder 12 as a position detector, at this time, the distance between mask M and workpiece W is computed and the deviation from the desired distance value computed.

(f) The above described actuations (d) and (e) are performed at at least three points on the mask surface/workpiece surface. Deviations of the distance are determined. Distance calibration device 4 sets the tilt of workpiece W and the distance between workpiece W and mask M such that the above described deviations are reduced.

The above described actuations are repeated until the deviations are less than or equal to an allowable value. The allowable value of the deviation is fixed suitably by the accuracy required for exposure of the component to be manufactured. To compute the deviations and for corresponding distance calibration, known processes can be used which are described in the publications cited, for example, in the prior art, or the like.

(g) At the conclusion of calibration of the distance between mask M and workpiece W, the distance measurement part 10 and the like are removed from the exposure area. Afterwards, exposure light is emitted from UV irradiation part 1, a given exposure carried out, and workpiece W transported on.

Action of the invention

As was described above, with the invention the following effects can be obtained:

(1) Even in areas with a low reflectance factor, as on a glass surface, 5 sufficient determination sensitivity can be obtained by the measure in which the light emitted from the light source for measurement purposes is irradiated via at least one pinhole and the objective lens onto the mask and workpiece, in which the light which has passed through the objective lens and the at least one pinhole and has been reflected by the mask and workpiece is detected by the light detection device, and in which the distance between the mask and workpiece is measured by this light intensity. Therefore, it is unnecessary to form reflection films, beam-optical elements and the like on the mask and workpiece. Thus, measurement anywhere on the mask surface and workpiece surface is possible. Furthermore, the mask is prevented from becoming expensive.

Additionally, it becomes possible, even in the case of a small distance, to advantageously separate the light reflected from the mask from the light reflected by the workpiece. Therefore, interference of the light reflected by the mask with the light reflected by the workpiece does not occur. As a result, measurement and confirmation become possible with high precision for the distance desired during exposure.

The arrangement of the workpiece carrier is moreover not limited and measurement anywhere is possible.

(2) By the measure in which the pinhole of the pinhole plate is one of several pinholes, even for a workpiece with low reflectance factor, as in a glass workpiece, sufficient reflection intensity can be obtained and the light reflected from the mask can be advantageously separated from the light reflected by the workpiece.

Furthermore, the scatter of the sensitivity of the first light detection element with respect to the position of the light which is incident in the light detection device can be averaged. Also, the fluctuation of the output value from the light detection device, in the case of vibration or position deviation of the pinhole plate and the like, can be reduced.

Moreover, the number of photons which reach the light detection device per unit of time can be increased without increasing the irradiance of the first light source. Thus, burning of the light detection device as a result of increasing the irradiance can be prevented.

(3) The measure in which, in the distance measurement part, there is a second light detection device and by computing the output signals from the light detection device and the second light detection device, the fluctuation of the light intensity of the light source for purposes of measurement is corrected, when the light intensity of the light source for measurement purposes fluctuates due to a fluctuation of the power source and the like, enables a measurement with high accuracy to be taken without being affected by the fluctuation of the light intensity of the light source for purposes of measurement.

(4) The arrangement of the polarizing beam splitter and the quarter wave plate makes it possible to prevent the light reflected by the pinhole plate from being incident in the light detection device. Therefore, the S/N ratio can be increased.

(5) The images of the mask and workpiece can be detected by the arrangement of the second light source and image detection element. In this way, the site to be measured can be easily positioned and the site to be measured can be positioned exactly relative to the mask opening, even if the workpiece is a video display element, such as a liquid crystal display device element, a plasma display panel, and the like.

(6) The measure in which the cross sectional shape of the light flux from the light source for measurement purposes on the surface on which the mask pattern is formed has a shape which can be encompassed by an opening formed in the mask pattern area prevents the light from being masked by the metallic film of the mask. Thus, the intensity of the light reflected by the mask and the intensity of the light reflected by the workpiece can be made essentially the same in a workpiece with a low reflectance factor, such as a glass workpiece. Thus, distance measurement with high accuracy is enabled.

As was described above, in the proximity exposure device of the invention, the distance between the mask and the workpiece can be measured with high precision. Therefore, the desired distance can be set with high precision by adjusting the distance calibration device using these measurement data.

I claim:

1. Proximity exposure device having distance adjustment device which comprises:

an ultraviolet radiation part for irradiation with UV radiation;

a mask carrier part for holding a mask stationary;

a workpiece carrier for holding a workpiece in a state in which the workpiece is adjacent to the mask with a distance therebetween;

a distance calibration device which is connected to the workpiece carrier for calibration of the distance between the workpiece and the mask;

a distance measurement part;

a device for movement of the distance measurement part in a direction perpendicular to the mask and workpiece;

a position detector for determining the position of the distance measurement part; and an arithmetic and logic unit for computing the distance between the mask and workpiece from an output signal of the light detection device and from an output signal of the position detector;

wherein the distance measurement part comprises a light source for measurement purposes, a beam splitter, a pinhole plate, an objective lens and a light detection device;

the light source for measurement purposes is arranged relative to the distance measurement part in a manner causing the light emitted from the light source to be focused via the beam splitter onto the pinhole plate;

the pinhole plate is located at a site which represents a focal point of the objective lens which is opposite a focal point on an object side; and the light detection device is located at a site where light which has been reflected by the mask and workpiece and which has passed through the objective lens, at least one pinhole, and the beam splitter can be detected.

2. Proximity exposure device with distance adjustment device as claimed in claim 1, wherein the at least one pinhole of the pinhole plate comprises a collection of several pinholes.

3. Proximity exposure device with distance adjustment device as claimed in claim 1, wherein the distance measurement part is equipped with a second light detection device;

the beam splitter is aligned such that the light from the light source for measurement purposes is divided into two parts, a first part of which is radiated onto the pinhole plate and a second part of which is incident in the second light detection device;

the arithmetic and logic unit corrects fluctuations of the light intensity of the light source for measurement purposes in response to output signals of the light detection device and second light detection device.

4. Proximity exposure device with distance adjustment device as claimed in claim 1, wherein:

the beam splitter is a polarizing beam splitter which polarizes the light emitted from the light source for measurement purposes in different first and second polarization directions, light with the first polarization direction being passed through and light with the second polarization direction being directed to the light detection device; and a quarter wave plate is located in an optical path between the pinhole plate and the focal point on the object side of the objective lens, by which quarter wave plate the light polarized by the polarizing beam splitter with the first polarization direction is converted into a circular polarization, and at the same time, light reflected by the mask and workpiece with the circular polarization is converted into light with the second polarization direction.

5. Proximity exposure device with distance adjustment device as claimed in claims 1, wherein:

a second light source and image detection element is provided in the distance measurement part;

the second light source is at a location at which light emitted therefrom will be radiated through the objective lens onto the mask and workpiece; and wherein an image detection element is located at a site where images of the mask and workpiece can be detected.

6. Proximity exposure device with distance adjustment device as claimed in claim 1, wherein a mask is provided for production of an image display element; and wherein a cross-sectional shape of light flux from the light source on a surface on which the mask pattern is formed can be encompassed by an opening formed in the mask pattern area.

* * * * *